(12) United States Patent
Lenci et al.

(10) Patent No.: US 8,916,962 B2
(45) Date of Patent: Dec. 23, 2014

(54) III-NITRIDE TRANSISTOR WITH SOURCE-CONNECTED HEAT SPREADING PLATE

(71) Applicant: IMEC, Leuven (BE)

(72) Inventors: Sylvia Lenci, Linden (BE); Stefaan Decoutere, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/101,710

(22) Filed: Dec. 10, 2013

(65) Prior Publication Data

US 2014/0159118 A1 Jun. 12, 2014

(30) Foreign Application Priority Data

Dec. 10, 2012 (EP) .................................... 12196215

(51) Int. Cl.

| | | |
|---|---|---|
| H01L 23/34 | (2006.01) | |
| H01L 21/00 | (2006.01) | |
| H01L 29/66 | (2006.01) | |
| H01L 23/482 | (2006.01) | |
| H01L 29/778 | (2006.01) | |
| H01L 21/28 | (2006.01) | |
| H01L 21/283 | (2006.01) | |
| H01L 21/308 | (2006.01) | |
| H01L 21/48 | (2006.01) | |
| H01L 29/417 | (2006.01) | |
| H01L 29/20 | (2006.01) | |

(52) U.S. Cl.
CPC ...... *H01L 29/66431* (2013.01); *H01L 23/4824* (2013.01); *H01L 29/778* (2013.01); *H01L 21/28247* (2013.01); *H01L 21/283* (2013.01); *H01L 21/308* (2013.01); *H01L 21/4814* (2013.01); *H01L 29/41758* (2013.01); *H01L 29/7786* (2013.01); *H01L 29/2003* (2013.01)
USPC .......................................... 257/707; 438/122

(58) Field of Classification Search
USPC .......................................... 257/707; 438/122
See application file for complete search history.

(56) References Cited

U.S. PATENT DOCUMENTS

| | | | |
|---|---|---|---|
| 8,138,529 B2 * | 3/2012 | Wu ................................ | 257/268 |
| 2006/0065910 A1 | 3/2006 | Ring et al. | |
| 2009/0072240 A1 * | 3/2009 | Suh et al. ......................... | 257/76 |
| 2011/0147796 A1 | 6/2011 | Haeberlen et al. | |

FOREIGN PATENT DOCUMENTS

EP 2293335 A2 9/2011

OTHER PUBLICATIONS

Srivastava, Puneet et al., "Silicon Substrate Removal of GaN DHFETs for Enhanced (>1100V) Breakdown Voltage", IEEE Electron Device Letters, vol. 31, No. 8, Aug. 2010, pp. 851-853.
Srivastava, P. et al., "Si Trench Around Drain (STAD) Technology of GaN-DHFETs on Si Substrate for Boosting Power Performance", Proc. International Electron Devices Meeting (IEDM), 2011, pp. 19.6.1-19.6.4.

\* cited by examiner

*Primary Examiner* — Lex Malsawma
(74) *Attorney, Agent, or Firm* — McDonnell Boehnen Hulbert & Berghoff LLP (57) ABSTRACT

Disclosed are semiconductor devices and methods for manufacturing them. An example device may include a III-nitride stack having a front side surface and a back side surface. The III-nitride stack may be formed of at least a first layer and a second layer, between which a heterojunction may be formed, such that a two-dimensional electron gas layer is formed in the second layer. A source electrode, a drain electrode, and a gate electrode positioned between the source and drain electrodes may be formed on the front side surface, and an insulation layer may be formed over the electrodes on the front side surface. A carrier substrate may be attached to the insulation layer. An electrically conductive back plate may be formed on the back side surface. The back plate may directly face the source electrode and the gate electrode, but not the drain electrode.

20 Claims, 6 Drawing Sheets

III-NITRIDE TRANSISTOR WITH SOURCE-CONNECTED HEAT SPREADING PLATE

CROSS-REFERENCE TO RELATED APPLICATION

The present application claims priority to European Patent Application Serial No. 12196215.3 filed Dec. 10, 2012, the contents of which are hereby incorporated by reference.

BACKGROUND

Gallium Nitride-on-Silicon (GaN-on-Si) power devices are affected by a parasitic conductive layer at an interface between the Si and the III/Nitride stack, which increases the buffer leakage current and reduces the breakdown voltage. This detrimental conductive path can be interrupted by removing the Si substrate, globally over the entire wafer, as described in, for example, "Silicon Substrate Removal of GaN DHFETs for enhanced (>1100V) Breakdown voltage," P. Srivastava et al., IEEE Electron Device Letters 31 (8), pp 851-853, 2010. Alternatively, the detrimental conductive path can be interrupted by removing the Si substrate selectively at specific locations, as described in, for example, "Si trench around drain (STAD) technology of GaN-DHFETs on Si substrate for boosting power performance," P. Srivastava et al., Proc. International Electron Devices Meeting (IEDM) 2011. Si removal has been proven to increase the breakdown voltage without increasing the buffer thickness. Moreover, a significant reduction of the buffer leakage current at high temperature has been reported with this technology, as shown in the second of the previously cited references.

SUMMARY OF THE INVENTION

The above-described Si removal may prove undesirable for at least two reasons. First, a substrate backgating problem may arise. The Si removal technique is designed for use with a floating substrate. In this case, any control on the back side voltage is lost, and undesirable back side gating can reduce the on-state current and increase the on-resistance. If a Si substrate is present, it is possible to connect it to the source, but this decreases the breakdown voltage. Second, a thermal dissipation problem may arise. The Si substrate may act as a heat sink. The region of maximum channel temperature is below the gate, especially at the drain-facing side. Therefore, when the Si substrate is removed, heat dissipation can be an issue.

Disclosed are semiconductor devices that include III-nitride layers forming a heterojunction to thereby create a high-electron mobility layer, which may also be referred to as a '2-dimensional electron gas' (2DEG), in one of the III-nitride layers. The disclosed devices may be, for example, high power devices, such as High Electron Mobility Transistors (HEMTs) produced on a silicon substrate. The III-nitride layers may be, for example, GaN and/or AlGaN layers, such as at least a stack of a GaN and AlGaN layer.

The present disclosure provides a technique that combines the advantages of Si substrate removal (i.e., interruption of conductive path in the Si) with the possibility of reducing backgating phenomena. The disclosure also addresses the issue of thermal dissipation and self-heating.

In one aspect, a III-nitride transistor is disclosed that includes a III-nitride stack including at least a first layer and a second layer. A heterojunction may be formed between the first layer and the second layer such that a two-dimensional electron gas layer is formed in the second layer. The III-nitride stack may have a back side surface adjacent to the first layer and a front side surface opposite the back side surface. The device may further include at least one electrode set formed on the front side surface. Each electrode set may include a source electrode, a drain electrode, and a gate electrode formed between the source electrode and the drain electrode. A first area may be formed by the source electrode, a region between the source electrode and the gate electrode, the gate electrode, and a region directly adjacent to the gate electrode. The first area may be separated from the drain electrode by a distance. The transistor may further include an insulation layer formed over the at least one electrode set on the front side surface and a carrier substrate attached to the insulation layer. Further, the transistor may include, for each of the at least one electrode sets, an electrically conductive back plate formed on the back side surface, a back side passivation layer formed on a portion of the back side surface not covered by the electrically conductive back plate, a source contact pad electrically connected to the source electrode, a drain contact pad electrically connected to the drain electrode, and a gate contact pad electrically connected to the gate electrode. The electrically conductive back plate may be electrically connected to the source electrode and may cover at least a second area of the back side surface that directly faces the first area, In another aspect, a III-nitride transistor device is disclosed that includes a III-nitride stack including at least a first layer and a second layer. A heterojunction may be formed between the first layer and the second layer such that a two-dimensional electron gas layer is formed in the second layer. The III-nitride stack may have a back side surface adjacent to the first layer and a front side surface opposite the back side surface. The device may further include a plurality of electrode sets formed on the front side surface. Each electrode set may include a source electrode, a drain electrode, and a gate electrode formed between the source electrode and the drain electrode. A first area may be formed by the source electrode, a region between the source electrode and the gate electrode, the gate electrode, and a region directly adjacent to the gate electrode. The first area may be separated from the drain electrode by a distance. The transistor may further include an insulation layer formed over the at least one electrode set on the front side surface and a carrier substrate attached to the insulation layer. Further, the transistor may include, for each of the at least one electrode sets, an electrically conductive back plate formed on the back side surface, a back side passivation layer formed on a portion of the back side surface not covered by the electrically conductive back plate, a source contact pad electrically connected to the source electrode, a drain contact pad electrically connected to the drain electrode, and a gate contact pad electrically connected to the gate electrode. The electrically conductive back plate may be electrically connected to the source electrode and may cover at least a second area of the back side surface that directly faces the first area. For each electrode set, each of the source electrode, the drain electrode, and the gate electrode may be finger-shaped and may interlock with the other electrodes.

In yet another aspect, a method is disclosed that includes providing a temporary substrate and forming on the temporary substrate a III-nitride stack that includes at least a first layer and a second layer. A heterojunction may be formed between the first layer and the second layer such that a two-dimensional electron gas layer is formed in the second layer. The III-nitride stack may have a back side surface adjacent to the first layer and a front side surface opposite the back side surface. The method further includes, in an active area on the front side surface, depositing and patterning at least one electrically conductive layer to form at least one electrode set. Each electrode set may include a source electrode, a drain electrode, and a gate electrode formed between the source electrode and the drain electrode. A first area may be formed by the source electrode, a region between the source electrode and the gate electrode, the gate electrode, and a region directly adjacent to the gate electrode. The first area may be separated from the drain electrode by a distance. The method further includes depositing an insulation layer over the at least one electrode set on the front side surface, permanently attaching a carrier substrate to the insulation layer, and removing the temporary substrate. The method further includes, for each of the at least one electrode sets, forming a source contact pad that is electrically connected to the source electrode, forming a drain contact pad that is electrically connected to the drain electrode, forming a gate contact pad that is electrically connected to the gate electrode, and forming an electrically conductive plate on the back side surface. The electrically conductive back plate may be electrically connected to the source electrode and may cover at least a second area of the back side surface that directly faces the first area.

The disclosed devices may be, for example, high power transistors. The disclosed devices may include a plurality of finger-shaped source and drain electrodes extending from laterally placed source and drain contact pads. A back side metallization of the source pad may be uniform with the source-connected heat spreading plates, the latter being preferably applied to said back side together with said metallization in a single process step. Anywhere in this description, the term 'source-connected heat spreading plate' may be replaced by 'source-connected heat spreading back gate'.

DETAILED DESCRIPTION

Figure 1:
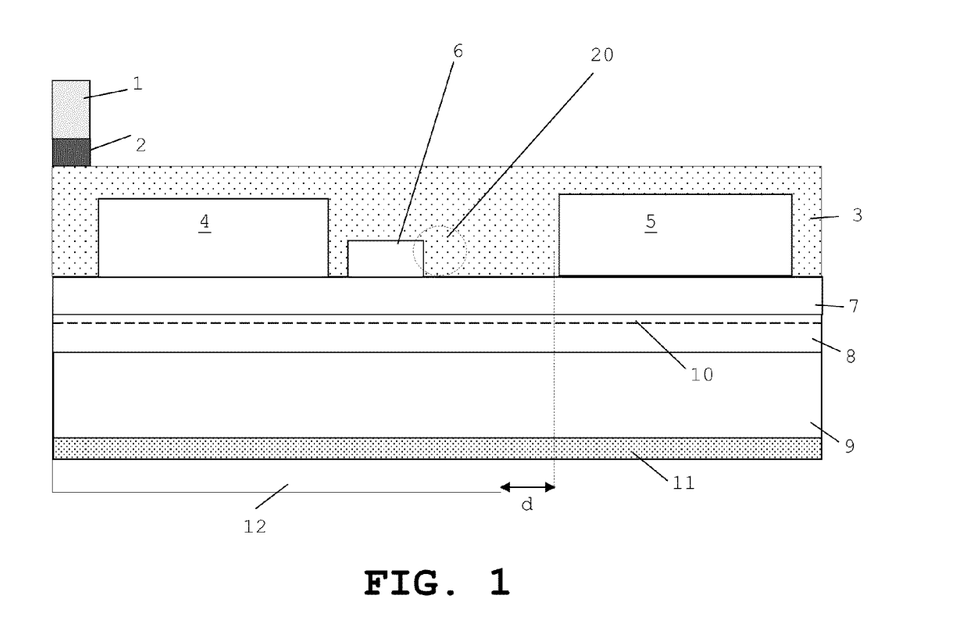
FIG. 1 illustrates an example device, according to some embodiments.
Figure 2:
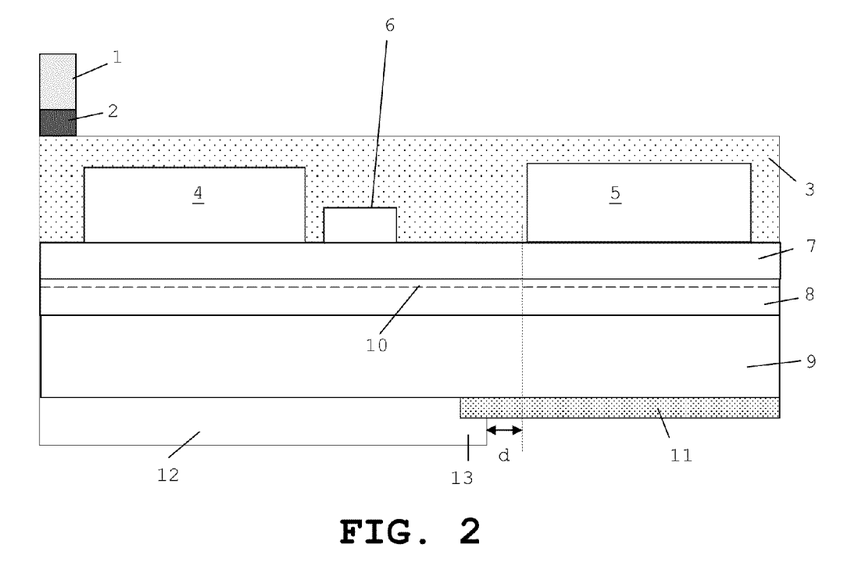
FIG. 2 illustrates an example device, according to some embodiments.
Figure 3:
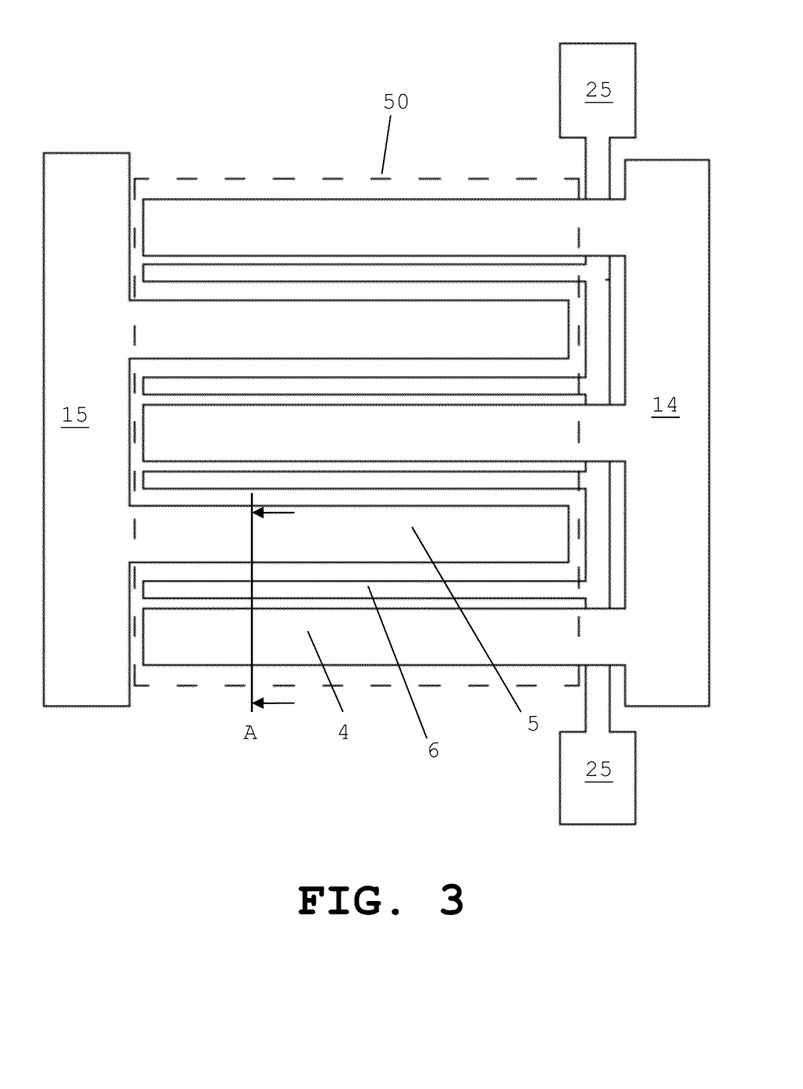
FIG. 3 illustrates a layout of an example device comprising multiple interlocking finger-shaped source and drain electrodes, according to some embodiments.

FIGS. 1 and 2 each illustrate a possible embodiment of a transistor according to the disclosure. The figures may be seen as cross-sections of a single transistor or of a portion of a high power High Electron Mobility Transistor (HEMT) device structure with multiple interlocking source and drain fingers, connected to contact pads, as illustrated in FIG. 3. As shown in FIG. 3, the HEMT device structure may include an active area 50. The active area may be, for example, the area in which actual currents take place through the transistor's channel when the transistor is conducting. The active area may be distinguished from, for example, the source and drain contact pads 14, 15. The views shown in FIGS. 1 and 2 may be seen as cross-sections taken in the active area 50, along the line indicated as 'A' in FIG. 3. Nevertheless, the disclosure is not limited to a particular transistor design.

As shown in FIG. 1, an example device may include a carrier substrate 1, a bonding layer 2, an insulation layer 3, a source electrode 4, a drain electrode 5, and a gate electrode 6. In some embodiments, the insulation layer 3 may be formed from a stack of insulation layers of different material and/or composition. The source electrode 4, drain electrode 5, and gate electrode 6 may be formed from a conductive material, such as, for example, a metal. Other conductive materials are possible as well. As shown, the gate electrode 6 is positioned between the source electrode 4 and the gate electrode 5.

As shown, the source electrode 4, drain electrode 5, and gate electrode 6 may be in contact with a III-nitride barrier layer 7, which may itself be in contact with a III-nitride channel layer 8. Further, as shown, the III-nitride channel layer 8 may be in contact with a III-nitride buffer layer 9. The stack formed from the III-nitride barrier layer 7, the III-nitride channel layer 8, and the III-nitride buffer layer 9 may be referred to as the III-nitride stack. When used with respect to a transistor according to the disclosure, the term 'III-nitride stack' may refer to the portion of the stack of active layers (such as the III-nitride barrier layer 7, the III-nitride channel layer 8, and the III-nitride buffer layer 9) that corresponds to the active area 50.

As shown, the III-nitride stack has a front surface and a back surface, each of which is substantially (e.g., approximately) parallel to the III-nitride barrier layer 7, the III-nitride channel layer 8, and the III-nitride buffer layer 9 of the stack.

The gate electrode 6 may be in direct contact with the III-nitride stack, as shown. Alternatively, in some embodiments, a gate dielectric (e.g., an oxide) may be positioned between the gate electrode 6 and the III-nitride stack.

In some embodiments, the III-nitride barrier layer 7 may be an aluminum gallium nitride (AlGaN) layer. Further, in some embodiments, the III-nitride channel layer 8 may be, for example, a stack of $Al_{1-x}Ga_xN$ layers, with varying values of x. Other suitable III-nitride materials known in the art are possible also (e.g., InGaN). The III-nitride barrier layer 7 and the III-nitride channel layer 8 may form a heterojunction between them. That is, these layers 7, 8 may differ in terms of the band gap of the respective materials of these layers 7,8, such that a two-dimensional electron gas (2DEG) layer 10 may be formed in the III-nitride channel layer 8. The 2DEG may be present permanently (such that the device functions as a "normally ON" device), or may be present only when a suitable external voltage is applied to one or more of the source electrode 4, the drain electrode 5, and the gate electrode 6 (such that the device functions as a "normally OFF" device).

In some embodiments, the III-nitride stack may comprise additional layers. It will be understood that other layers, other materials, and various layer thicknesses may be used to form the 2DEG layer 10.

To form the device, the III-nitride buffer layer 9 may be formed on a temporary substrate, such as a silicon substrate (not shown). In some embodiments, the temporary substrate may include a nucleation layer on its surface to minimize mismatch between the temporary substrate and the III-nitride buffer layer 9. The III-nitride channel layer 8 may be formed on the III-nitride buffer layer 9, and the III-nitride barrier layer 7 may be formed on the III-nitride channel layer 8. The source electrode 4, the drain electrode 5, gate electrode 6, and the insulation layer 3 may be formed on the III-nitride channel layer 8. Each of the III-nitride buffer layer 9, the III-nitride channel layer 8, the III-nitride barrier layer 7, the source electrode 4, the drain electrode 5, gate electrode 6, and the insulation layer 3 may be formed using typical growth or deposition techniques.

The temporary substrate (on which the III-nitride buffer layer 9, the III-nitride channel layer 8, the III-nitride barrier layer 7, the source electrode 4, the drain electrode 5, gate electrode 6, and the insulation layer 3 are formed) may then be permanently bonded to the carrier substrate 1. In particular, the insulation layer 3 may be attached to the carrier substrate 1 by the bonding layer 2. Thereafter, the temporary substrate may be removed entirely using a typical removal technique (e.g., grinding and/or etching).

On the completed device, the side of the device having the carrier substrate 1 may be referred to as the "front side" of the device, and the side of the device having the III-nitride buffer layer 9 may be referred to as the "back side" of the device.

In some embodiments, a back side passivation layer 11 may be formed (e.g., by deposition) on the back side of the device (i.e., on the III-nitride buffer layer 9, as shown). An electrically conductive back side layer 12 may then be formed on the back side passivation layer 11, as shown. The electrically conductive back side layer 12 may be, for example, a metal layer. As shown, the electrically conductive back side layer 12 may cover an area corresponding to the source electrode 4 and the gate electrode 5, as well as a portion of the area corresponding to an area between the gate electrode 5 and the drain electrode 5.

The electrically conductive back side layer 12 may be electrically connected to the source electrode 4, such that the electrically conductive back side layer 12 may serve as a source-connected heat spreading plate. In some embodiments (such as that shown in FIG. 3), the electrical connection between the electrically conductive back side layer 12 and the source electrode 4 may take place between a metal connection from the back side of the device to the front side of the device. The metal connection may contact the source pad 14 (shown in FIG. 3) in an area outside the active area 50. Other electrical connections are possible as well.

The source-connected heat spreading plate may serve two functions. First, the source-connected heat spreading plate may connect the source electrode 4 to the back side of the device. In this manner, the source-connected heat spreading plate may also serve as a back side field plate. The back side field plate may reduce a back side gating effect (as described above), even following removal of the temporary substrate (as described above). Removal of the temporary substrate may eliminate parasitic conductivity at an interface between the temporary substrate and the III-nitride stack. Second, the source-connected heat spreading plate may be positioned in a region of maximum junction temperature, namely the region between the gate electrode 6 and the drain electrode 5, closest to the gate (approximated as area 20 in FIG. 1). In this manner, the source-connected heat spreading plate may also serve as a heat sink. The term "source-connected heat spreading plate" may be understood to encompass both the back side field gate and heat sink functions of the electrically conductive back side layer 12.

As shown, the source-connected heat spreading plate 12 does not fully cover an area corresponding to the drain electrode 5. As a result, in some instances (depending on a thickness and materials of the III-nitride stack), breakdown of the device may be possible through a current path between the drain electrode 5 and the source-connected heat spreading plate 12 when the transistor is in off-state and high voltage is applied to the drain electrode 5. Accordingly, in some embodiments a distance (labelled "d" in FIG. 1) between an edge of the source-connected heat spreading plate 12 and the drain electrode 5 may be optimized in order to maximize or tune the voltage at which breakdown through this current path occurs.

FIG. 2 illustrates another example device, in accordance with some embodiments. As shown in FIG. 2, the source-connected heat spreading plate 12 may be in direct contact with the buffer layer 9. As in the device shown in FIG. 1, the source-connected heat spreading plate 12 does not cover the area corresponding to the drain electrode 5.

The device of FIG. 2 may be obtained by first depositing and patterning the back side passivation layer 11. Through the patterning, openings may be created in the back side passivation layer 11. Thereafter, the source-connected heat spreading plate 12 may be formed by depositing a metal layer in the openings. In some embodiments, the metal layer may be deposited only in the openings. Alternatively, in some embodiments, the metal layer may be deposited everywhere and subsequently patterned, which may result in the small overlap 13 shown in FIG. 2. While these embodiments may require more process steps, the direct contact between the source-connected heat spreading plate 12 and the III-nitride stack may allow for optimizing the heat spreading capability of the plate. In some embodiments, the lateral distance d between the source-connected heat spreading plate 12 and the drain electrode 5 may be optimized to maximize or tune the breakdown voltage, as described above.

While the source-connected heat spreading plate 12 is shown to have a particular size and shape, it will be understood that other sizes and shapes are possible as well. For example, in some embodiments (such as those in which the source electrode 4 and the drain electrode 5 are bar-shaped), the source-connected heat spreading plate 12 may be rectangular. Other examples are possible as well. In general, the source-connected heat spreading plate 12 may be of such a size and shape as to cover at least an area of the device's back side surface that is directly facing an area 20 between the gate electrode 6 and the drain electrode 4, and directly adjacent to the gate electrode 6, as shown. 'Directly facing' means that the area on the back side is the mirror image of the corresponding area on the front side, with respect to the center plane between the back side and front side.

FIG. 3 illustrates a layout of an example device comprising multiple interlocking finger-shaped source and drain electrodes, according to some embodiments. As shown, the example device may be included in a high power HEMT device structure. A source electrode 4, a drain electrode 5, and a gate electrode 6 are included in an active area 50, as shown. Further, the device structure may include source contact pads 14, drain contact pads 15, and gate contact pads 25. As shown, the source electrode 4 and the drain electrode 5 may each be finger-shaped, and the source electrode 4 and the drain electrode 5 may interlock in the active area 50.

Figure 4A:
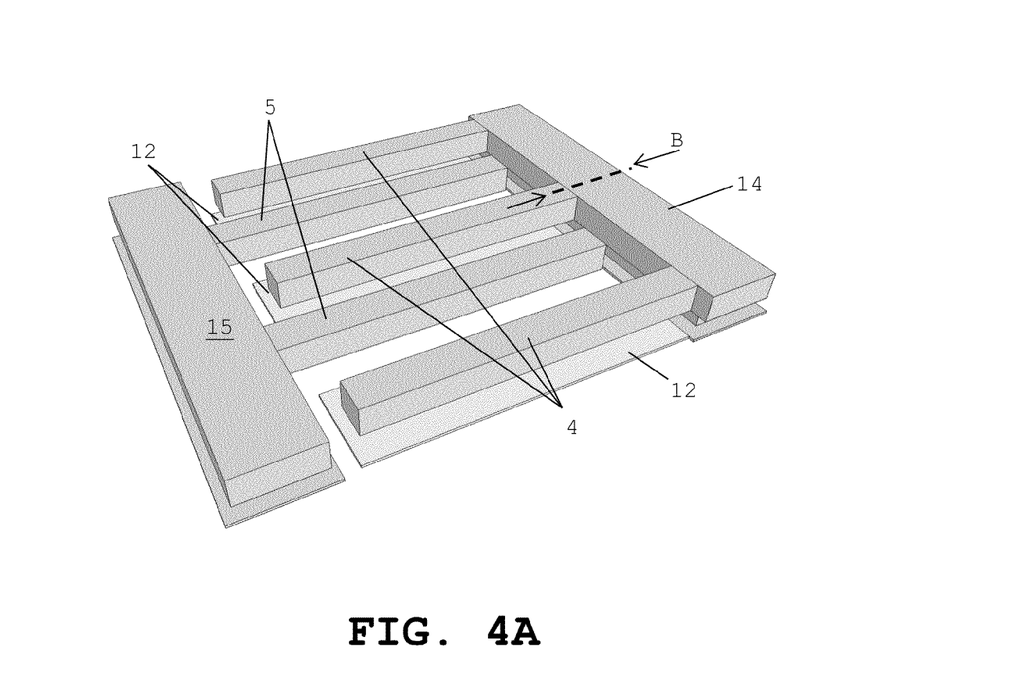
FIGS. 4A-B illustrate three-dimensional views of source and drain metallization in an example device, according to some embodiments.
Figure 4B:
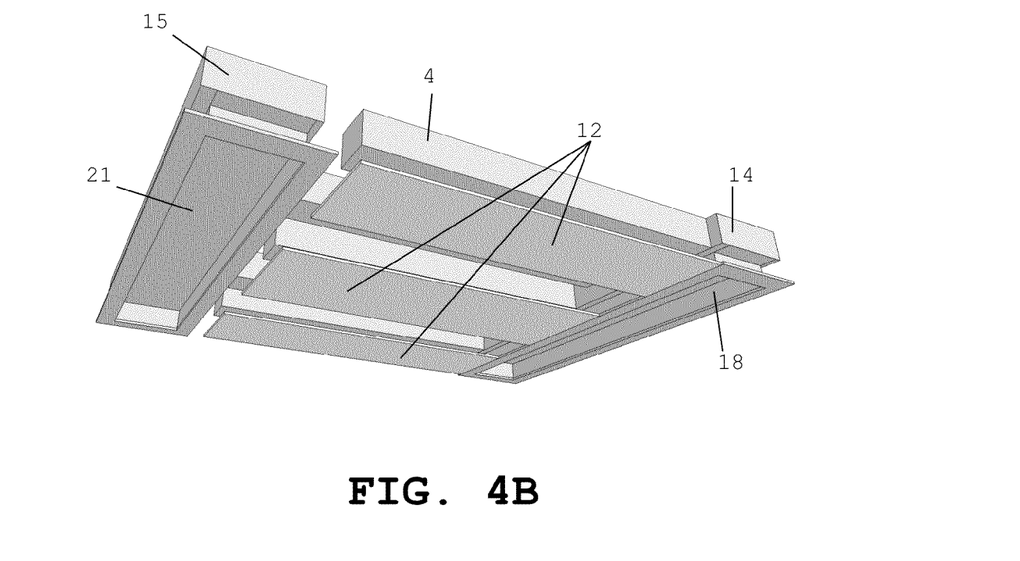

FIGS. 4A-B illustrate three-dimensional views of source and drain metallization in an example device, according to some embodiments. The example device may, for example, be any of the devices described above in connection with FIG. 1 and FIG. 2. Further, the example device may be included in a device structure, such as the device structure described above in connection with FIG. 3.

FIG. 4A illustrates the example device from a front side of the device. Source electrodes 4 and drain electrodes 5 are indicated in FIG. 4A, along with source contact pads 14 and drain contact pads 15. The source contact pads 14 may be electrically connected to (and, in some embodiments, uniform with) the source electrodes 4. Similarly, the drain contact pads 15 may be electrically connected to (and, in some embodiments, uniform with) the drain electrodes 5. Source-connected heat spreading plates 12 may be seen beneath the source electrodes 4 and drain electrodes 5. While gate electrodes 4 and the III-nitride stack are not visible in FIGS. 4A-B, it will be understood that these elements may be included in the device as well.

FIG. 4B illustrates the device from a back side of the device. As shown, the device may include a back side source metallization 18 and a back side drain metallization 21. The source-connected heat spreading plates 12 may be connected to the back side source metallization 18. The back side source metallization 18 is further described below in connection with FIG. 5, which shows a vertical cross-section through the source contact pads 14 (along the line B in FIG. 4A).

Figure 5:
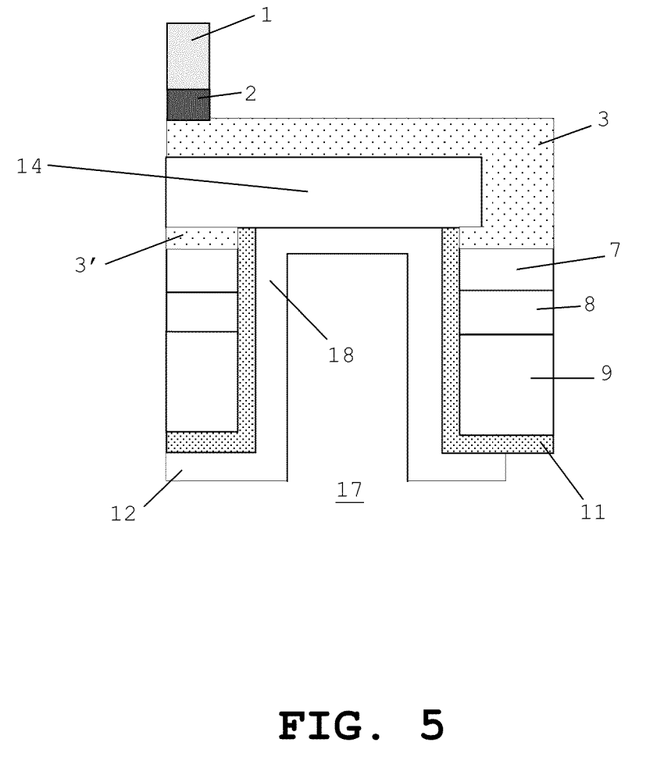
FIG. 5 illustrates a cross-section of a source pad area of an example device, according to some embodiments.

As shown in FIG. 5, the device includes a carrier substrate 1, a bonding layer 2, an insulation layer 3, a III-nitride barrier layer 7, a III-nitride channel layer 8, and a III-nitride buffer layer 9. As shown, the source contact pad 14 is uniform with the finger-shaped source electrodes 4. In the source contact pad 14, a portion 3' of the insulation layer 3 is present between the source contact pad 14 and the III-nitride barrier layer 7. The portion 3' does not extend underneath the active area 50.

The device may be contacted from the back side of the device by etching a via 17, as shown, and depositing a metal layer 18 into the via 17. The metal layer 18 may be in contact with the source contact pad 14, as shown. In some embodiments, the metal layer may extend underneath the active area 50 to form the source-connected heat spreading plates 12 described above, as well as the back side source metallization 18 described above, such that the source-connected heat spreading plates 12 and the back side source metallization 18 are uniform.

In some embodiments, prior to deposition of the metal layer 18, a back side passivation layer 11 may be deposited into the via 17 and on the entire back side of the device (including the source contact pad 14 and the active area 50. The passivation layer 11 may then be removed from the bottom of the via 17 (e.g., by an etching technique), and the metal layer 18 may be deposited on an in contact with the passivation layer 11 as well as in the bottom of the via 17 (where it is deposited on an in contact with the source contact pad 14). The metal layer 18 may then be patterned to form the source-connected heat spreading plates 12 only underneath the finger-shaped source electrodes 4 and gate electrodes 6, as shown in FIG. 1.

Figure 6A:
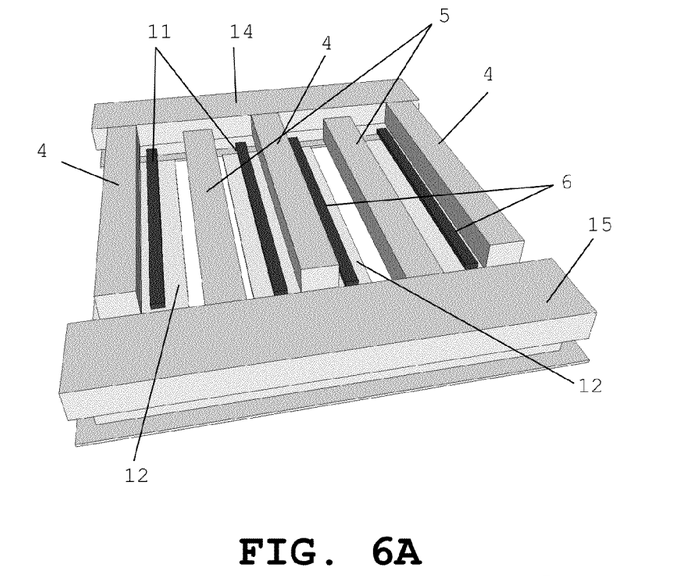
FIGS. 6A-B illustrate three-dimensional views of source and drain structures in an example device, according to some embodiments.
Figure 6B:
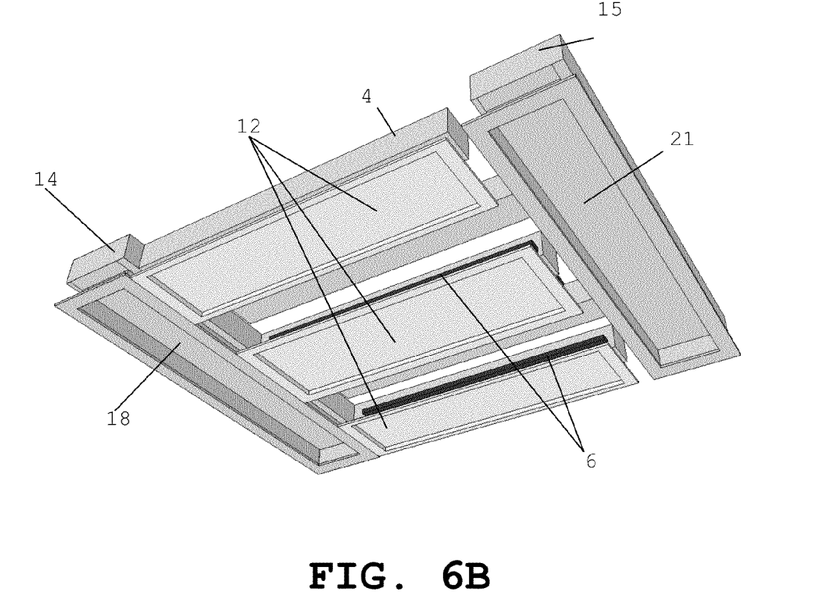

FIGS. 6A-B illustrate three-dimensional views of source and drain structures in another example device, according to some embodiments. As shown in FIGS. 6A-B, the back side passivation layer 11 may be patterned in the active area 50 before the metal layer 18 is deposited, and the metal layer 18 may be patterned to form the source-connected heat spreading plates 12 underneath the finger-shaped source electrodes 4 and gate electrodes 6. In this manner, source-connected heat spreading plates 12 having a small overlap with the back side passivation layer 11 (as described above in connection with FIG. 2) may be obtained.

As shown, the device includes laterally placed source contact pads 14 and drain contact pads 15. In some embodiments, the back side passivation layer 11 may be deposited in the source contact pads 14 and the drain contact pads 15, as described above in connection with FIG. 5, in order to avoid shorting of the III-nitride layers.

In another aspect, a method is disclosed for manufacturing the disclosed devices. In some embodiments, the method may include providing a temporary substrate and forming a III-nitride stack on the temporary substrate. The III-nitride stack may include a III-nitride barrier layer in contact with the temporary substrate, a III-nitride channel layer in contact with the III-nitride barrier layer, and a III-nitride buffer layer in contact with the III-nitride channel layer. The method may further include forming source electrodes, drain electrodes, and gate electrodes on the III-nitride stack and forming an insulation layer (e.g., a stack of insulation layers) over the source electrodes, drain electrodes, gate electrodes, and III-nitride stack. The method may further include attaching the insulation layer to a carrier substrate by a bonding layer and, thereafter, removing the temporary substrate.

The III-nitride stack may cover an area larger than an active area of the device. To this end, layers of the III-nitride stack may be deposited on a larger substrate and processed to form multiple III-nitride stacks for multiple devices formed on the larger substrate.

The deposition of the III-nitride stack, the deposition and patterning of the electrodes and the deposition of the insulating layer can be performed according to any suitable technique. Further, the carrier substrate may be attached according to any suitable technique, and the temporary substrate may be removed according to any suitable technique. Still further, the deposition and patterning of the source-connected heat spreading plate may be performed according to any suitable technique.

In some embodiments, the source-connected heat spreading plate may be formed of, for example, an Al-based metal of about 1 μm thick, deposited by sputtering or evaporation. Other source-connected heat spreading plates are possible as well.

The back side passivation layer may be any dielectric layer suitable for passivating the back side of the III-nitride layer. For example, the back side passivation layer may be a silicon oxide ($SiO_2$) layer or a silicon nitride layer ($Si_3N_4$). Other back side passivation layers are possible as well.

In some embodiments, the back side passivation layer may be deposited on the III-nitride stack's back side before deposition of the source-connected heat spreading plate. The passivation layer may be first patterned to form openings in the passivation layer. The metal layer for forming the source-connected heat spreading plates may be deposited in the openings and on the remainder of the passivation layer, after which the metal layer may be patterned to form the separate plates, possibly overlapping the passivation layer (e.g., as described above in connection with FIG. 2). A passivation layer may be present on every area of the back side of the III-nitride stack where no source-connected heat spreading layer is present.

In embodiments where the device takes the form of the multi-fingered electrode device illustrates in FIGS. 3-6B, the source contact pads 14, drain contact pads 15, and gate contact pads 25 may be deposited and patterned together with the source electrodes 4, drain electrodes 5, and gate electrodes 6. The source-connected heat spreading plate may be obtained in the same deposition step as the back side metallization 18 of the source contact pads 14, after etching vias 17 through the back side of the III-nitride stack, stopping on the source contact pads 14.

As shown in FIG. 5, the back side passivation layer may be deposited conformally after formation of the vias, so that it lines the sides and bottom of the vias. Thereafter, the back side passivation layer is removed from the bottom. In this way, the sides of the vias may remain covered by the passivation material, thereby avoiding shorting of the layers of the III-nitride stack. The metal layer may then by deposited after removal of the passivation layer from the bottom of the vias. Even when no back side passivation layer is to be deposited on the back side of the III-nitride stack directly facing the active area, it may be desirable to avoid shorting of the III-nitride layers in the above described way, by depositing and patterning said passivation layer only in the source and drain contact pads.

In the foregoing description, a patterning step is to be understood as any procedure in which portions of a layer are removed by etching away said portions while the remainder of the layer is protected by an etch mask, leaving a pattern formed by the remaining parts of the layer. The patterning may take place by known photolithography techniques involving a resist layer, or by hard mask techniques, equally known in the art.

In the claims and descriptions, letters or words between brackets that are not referring to numerical references in the drawings, indicate optional features or optional plural forms. For example, 'layer(s)' is to be read as 'layer or layers', and 'said (stack of) insulating layer(s)' is to read as 'said insulating layer or said stack of insulating layers'.

While the disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The foregoing description details certain embodiments of the disclosure. It will be appreciated, however, that no matter how detailed the foregoing appears in text, the disclosure may be practiced in many ways, and is therefore not limited to the embodiments disclosed. It should be noted that the use of particular terminology when describing certain features or aspects of the disclosure should not be taken to imply that the terminology is being re-defined herein to be restricted to include any specific characteristics of the features or aspects of the disclosure with which that terminology is associated.

Unless specifically specified, the description of a layer being deposited or produced 'on' another layer or substrate, includes the options of (1) the layer being produced or deposited directly on, i.e. in contact with, the other layer or substrate, and (2) the layer being produced on one or a stack of intermediate layers between the layer and the other layer or substrate.

We claim:

1. A transistor comprising:
    a III-nitride stack comprising at least a first layer and a second layer, wherein a heterojunction is formed between the first layer and the second layer such that a two-dimensional electron gas layer is formed in the second layer, and wherein the III-nitride stack has a back side surface adjacent to the first layer and a front side surface opposite the back side surface;
    at least one electrode set formed on the front side surface, wherein each electrode set comprises a source electrode, a drain electrode, and a gate electrode formed between the source electrode and the drain electrode, wherein a first area is formed by the source electrode, a region between the source electrode and the gate electrode, the gate electrode, and a region directly adjacent to the gate electrode, and wherein the first area is separated from the drain electrode by a distance;
    an insulation layer formed over the at least one electrode set on the front side surface;
    a carrier substrate attached to the insulation layer; and
    for each of the at least one electrode sets:
        (i) an electrically conductive back plate formed on the back side surface, wherein the electrically conductive back plate is electrically connected to the source electrode and covers at least a second area of the back side surface that directly faces the first area,
        (ii) a back side passivation layer formed on a portion of the back side surface not covered by the electrically conductive back plate,
        (iii) a source contact pad electrically connected to the source electrode,
        (iv) a drain contact pad electrically connected to the drain electrode, and
        (v) a gate contact pad electrically connected to the gate electrode.

2. The transistor of claim 1, wherein:
    a current path exists between the drain electrode and the electrically conductive back plate, such that breakdown of the transistor occurs through the current path when the transistor is in an off-state and a predetermined voltage is applied to the drain electrode; and
    the first distance is selected to maximize the predetermined voltage.

3. The transistor of claim 1, further comprising a passivation layer formed on the back side surface, wherein the electrically conductive back plate being formed on the back side surface comprises the electrically conductive back plate being formed on and in contact with the passivation layer.

4. The transistor of claim 1, wherein, for each electrode set:
    the source electrode is finger-shaped and extends laterally from the source contact pad;
    the drain electrode is finger-shaped and extends laterally from the drain contact pad; and
    the gate electrode is finger-shaped and extends laterally from the gate contact pad.

5. The transistor of claim 4, wherein the source contact pad and the gate contact pad are opposite the drain contact pad, such that the source electrode, the drain electrode, and the gate electrode interlock.

6. The transistor of claim 1, wherein, for each electrode set:
    the source contact pad comprises a source back side metallization layer; and
    the drain contact pad comprises a drain back side metallization layer.

7. The transistor of claim 6, wherein the source back side metallization layer, the drain back side metallization layer, and the electrically conductive back plate are formed from the same layer.

8. A transistor comprising:
    a III-nitride stack comprising at least a first layer and a second layer, wherein a heterojunction is formed between the first layer and the second layer such that a two-dimensional electron gas layer is formed in the second layer, and wherein the III-nitride stack has a back side surface adjacent to the first layer and a front side surface opposite the back side surface;
    a plurality of electrode sets formed on the front side surface, wherein each electrode set comprises a source electrode, a drain electrode, and a gate electrode formed between the source electrode and the drain electrode, wherein a first area is formed by the source electrode, a region between the source electrode and the gate electrode, the gate electrode, and a region directly adjacent to the gate electrode, and wherein the first area is separated from the drain electrode by a distance;
an insulation layer formed over the at least one electrode set on the front side surface;
a carrier substrate attached to the insulation layer; and
for each of the at least one electrode sets:
(i) an electrically conductive back plate formed on the back side surface, wherein the electrically conductive back plate is electrically connected to the source electrode and covers at least a second area of the back side surface that directly faces the first area,
(ii) a back side passivation layer formed on a portion of the back side surface not covered by the electrically conductive back plate,
(iii) a source contact pad electrically connected to the source electrode,
(iv) a gate contact pad and electrically connected to the gate electrode, and
(v) a drain contact pad positioned opposite the source contact pad and the gate contact pad and electrically connected to the drain electrode, wherein each of the source electrode, the drain electrode, and the gate electrode is finger-shaped and interlocks with the other electrodes.

9. The transistor of claim 8, wherein:
a current path exists between the drain electrode and the electrically conductive back plate, such that breakdown of the transistor occurs through the current path when the transistor is in an off-state and a predetermined voltage is applied to the drain electrode; and
the first distance is selected to maximize the predetermined voltage.

10. The transistor of claim 8, further comprising a passivation layer formed on the back side surface, wherein the electrically conductive back plate being formed on the back side surface comprises the electrically conductive back plate being formed on and in contact with the passivation layer.

11. The transistor of claim 8, wherein, for each electrode set:
the source electrode is finger-shaped and extends laterally from the source contact pad;
the drain electrode is finger-shaped and extends laterally from the drain contact pad; and
the gate electrode is finger-shaped and extends laterally from the gate contact pad.

12. The transistor of claim 11, wherein the source contact pad and the gate contact pad are opposite the drain contact pad, such that the source electrode, the drain electrode, and the gate electrode interlock.

13. The transistor of claim 8, wherein, for each electrode set:
the source contact pad comprises a source back side metallization layer; and
the drain contact pad comprises a drain back side metallization layer.

14. The transistor of claim 13, wherein the source back side metallization layer, the drain back side metallization layer, and the electrically conductive back plate are formed from the same layer.

15. A method comprising:
providing a temporary substrate;
forming on the temporary substrate a III-nitride stack comprising at least a first layer and a second layer, wherein a heterojunction is formed between the first layer and the second layer such that a two-dimensional electron gas layer is formed in the second layer, and wherein the III-nitride stack has a back side surface adjacent to the first layer and a front side surface opposite the back side surface;
in an active area on the front side surface, depositing and patterning at least one electrically conductive layer to form at least one electrode set, wherein each electrode set comprises a source electrode, a drain electrode, and a gate electrode formed between the source electrode and the drain electrode, wherein a first area is formed by the source electrode, a region between the source electrode and the gate electrode, the gate electrode, and a region directly adjacent to the gate electrode, and wherein the first area is separated from the drain electrode by a distance;
depositing an insulation layer over the at least one electrode set on the front side surface;
permanently attaching a carrier substrate to the insulation layer;
removing the temporary substrate;
for each of the at least one electrode sets:
(i) forming a source contact pad that is electrically connected to the source electrode,
(ii) forming a drain contact pad that is electrically connected to the drain electrode,
(iii) forming a gate contact pad that is electrically connected to the gate electrode, and
(iv) forming an electrically conductive plate on the back side surface, wherein the electrically conductive back plate is electrically connected to the source electrode and covers at least a second area of the back side surface that directly faces the first area.

16. The method of claim 15, wherein:
a current path exists between the drain electrode and the electrically conductive back plate, such that breakdown of the transistor occurs through the current path when the transistor is in an off-state and a predetermined voltage is applied to the drain electrode; and
the first distance is selected to maximize the predetermined voltage.

17. The method of claim 15, further comprising forming a passivation layer on the back side surface, wherein the electrically conductive back plate being formed on the back side surface comprises the electrically conductive back plate being formed on and in contact with the passivation layer.

18. The method of claim 15, wherein, for each electrode set:
the source electrode is finger-shaped and extends laterally from the source contact pad;
the drain electrode is finger-shaped and extends laterally from the drain contact pad; and
the gate electrode is finger-shaped and extends laterally from the gate contact pad.

19. The method of claim 18, wherein the source contact pad and the gate contact pad are positioned opposite the drain contact pad, such that the source electrode, the drain electrode, and the gate electrode interlock.

20. The method of claim 15, further comprising, for each electrode set:
etching a first via in the back side surface of the III-nitride stack, wherein the first via stops at the source contact pad;
etching a second via in the back side surface of the III-nitride stack, wherein the second via stops at the drain contact pad;
etching a third via in the back side surface of the III-nitride stack, wherein the third via stops at the gate contact pad;

depositing a metallization layer in each of the first, second, and third vias; and depositing the metallization layer on at least a portion of the back side surface, thereby forming the electrically conductive back plate.

\* \* \* \* \*